United States Patent [19]

Charruau

[11] Patent Number: 4,514,786
[45] Date of Patent: Apr. 30, 1985

[54] INTEGRATED-CIRCUIT SUPPORT DEVICE EMPLOYED IN A SYSTEM FOR SELECTING HIGH-RELIABILITY INTEGRATED CIRCUITS

[75] Inventor: Stephane Charruau, Paris, France
[73] Assignee: Thomson-CSF, Paris, France
[21] Appl. No.: 618,780
[22] Filed: Jun. 12, 1984

Related U.S. Application Data

[63] Continuation of Ser. No. 396,451, Jul. 8, 1982, abandoned.

[30] Foreign Application Priority Data

Jul. 10, 1981 [FR] France ................. 81 13681

[51] Int. Cl.³ .................. H02H 3/20; H05K 1/14
[52] U.S. Cl. .................... 361/413; 361/412; 361/415; 361/91; 361/56; 324/73 PC
[58] Field of Search ........... 361/412, 413, 415, 91, 361/56; 324/73 PC, 158 R, 158 F, 73 R; 339/17 R, 17 LC, 17 L, 17 M, 17 LM, 17 CF, 17 C, 45 M

[56] References Cited

U.S. PATENT DOCUMENTS

| | | | |
|---|---|---|---|
| 3,288,915 | 11/1966 | Hatfield et al. | 361/413 X |
| 3,300,686 | 1/1967 | Johnson et al. | 361/413 |
| 3,609,547 | 9/1971 | Slusser . | |
| 3,656,058 | 4/1972 | Leathers . | |
| 3,808,505 | 4/1974 | Reimer | 361/413 |
| 3,842,346 | 10/1974 | Bobbitt . | |
| 3,934,159 | 1/1976 | Nomiya et al. | 361/91 X |
| 4,145,620 | 3/1979 | Dice | 324/73 PC |
| 4,150,331 | 4/1979 | Lacher | 324/73 PC |

FOREIGN PATENT DOCUMENTS 2525632 12/1976 Fed. Rep. of Germany ........ 361/91

OTHER PUBLICATIONS

Electronique Industrielle et Microelectronique, No. 130, Jan.-Feb. 1970.
IBM Technical Disclosure Bulletin, vol. 21, Nov. 1978, No. 6.

*Primary Examiner*—Patrick R. Salce
*Attorney, Agent, or Firm*—Oblon, Fisher, Spivak, McClelland & Maier

[57] ABSTRACT

The support device permits the use of only one type of plate for selecting the different types of integrated circuits having spacing values of 0.3 inch or 0.4 inch or 0.6 inch between the two rows of terminal pins. The plate consists of a parent card in the form of a double-face printed circuit and of a plurality of daughter cards in the form of a multilayer circuit. The integrated circuits are supported by tulip-type plug sockets disposed at intervals in a number of rows in order to conform to the different spacing values. Each dynamic signal is distributed to the integrated-circuit terminal pins having the same reference number via a protection circuit comprising a diode in series, a voltage-dividing bridge and a diode connected in shunt between the common point and ground. Provision is made for U-link matching means in order to apply instead of the dynamic signal a direct-current supply or a ground when so required by the type of integrated circuit to be selected.

10 Claims, 9 Drawing Figures

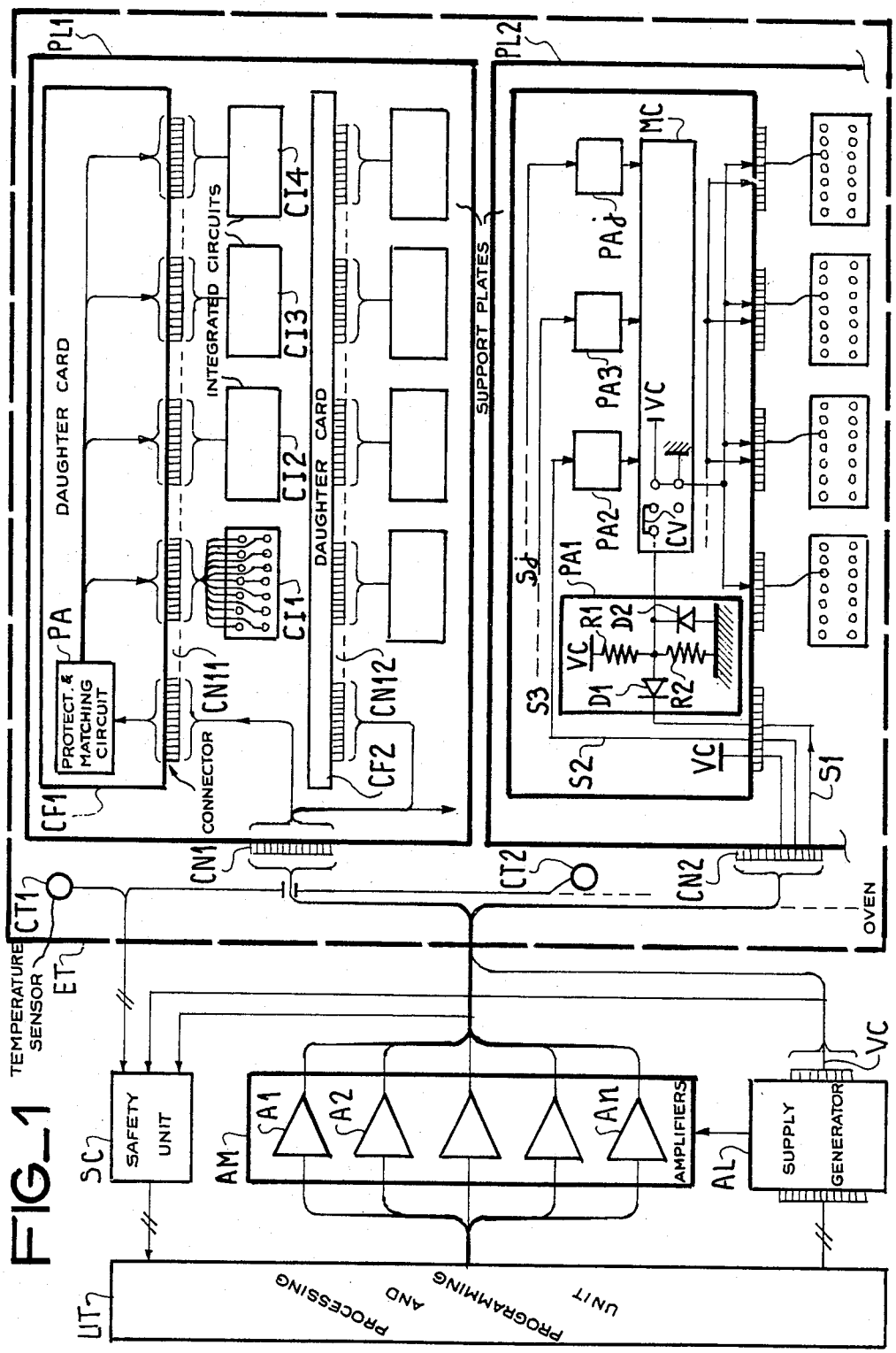

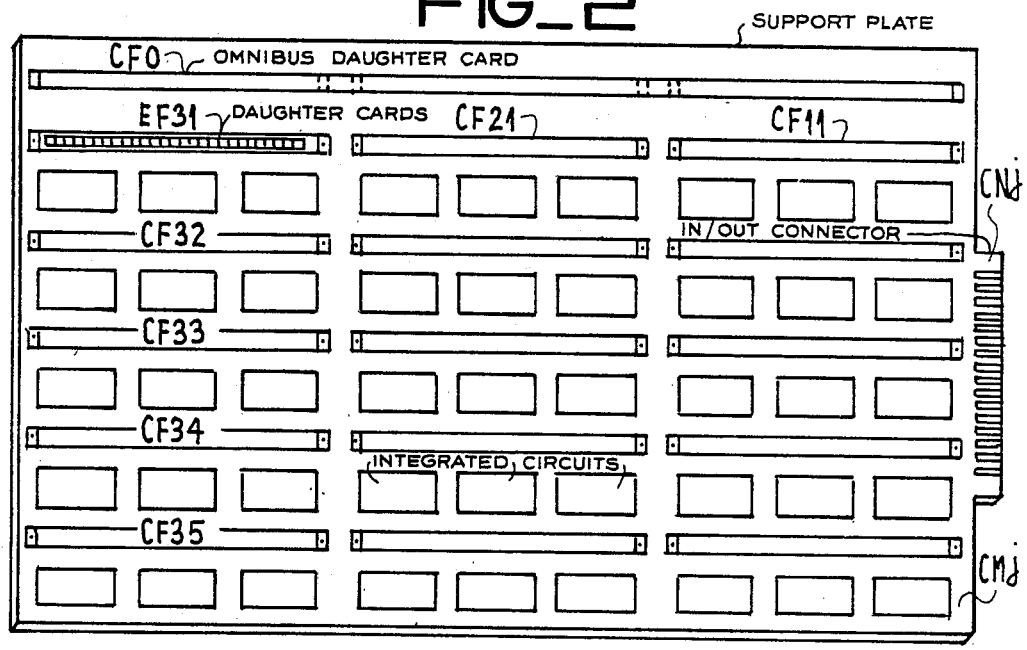
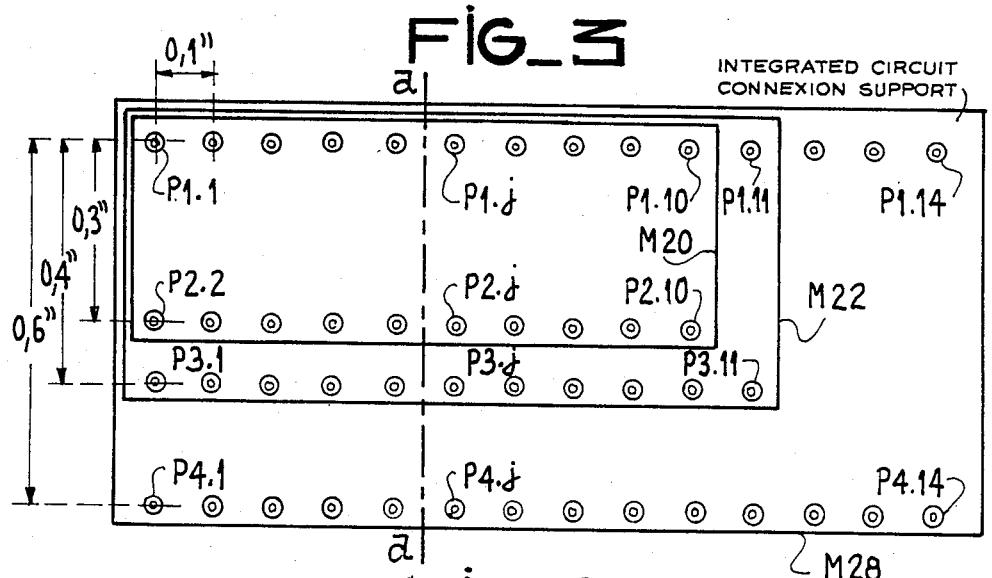
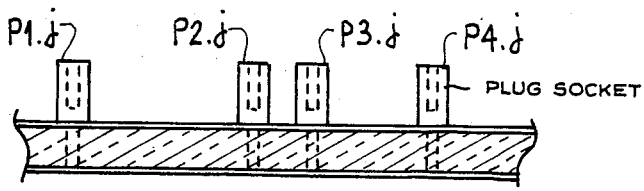

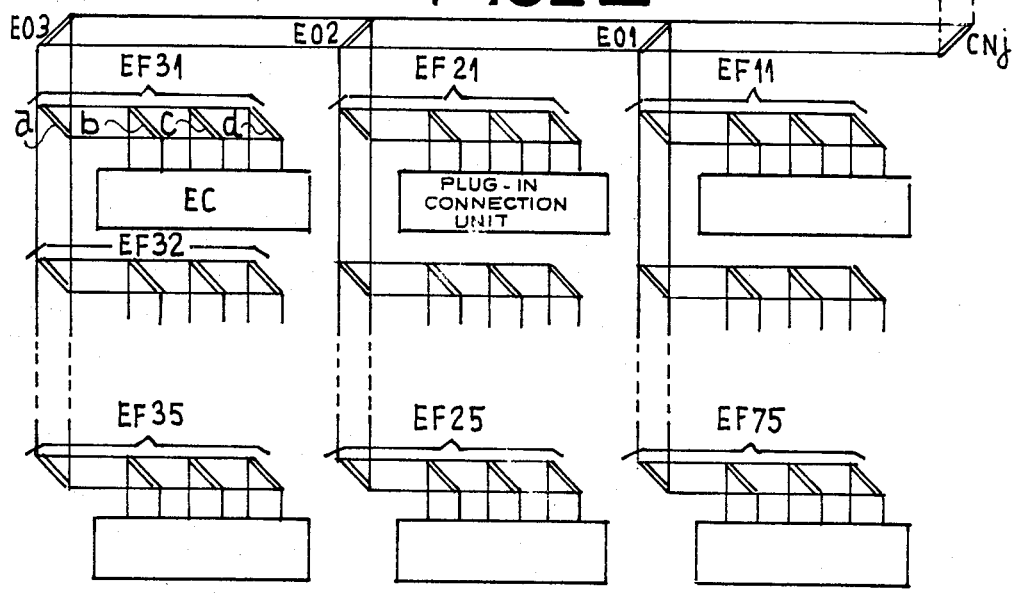
FIG_5
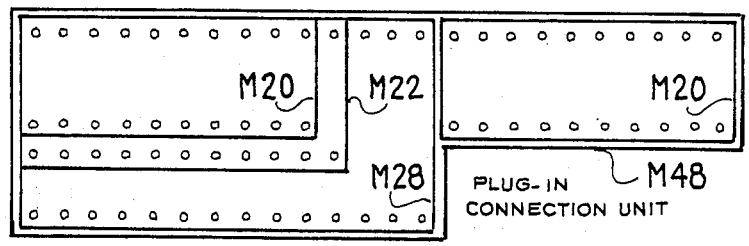
FIG_6
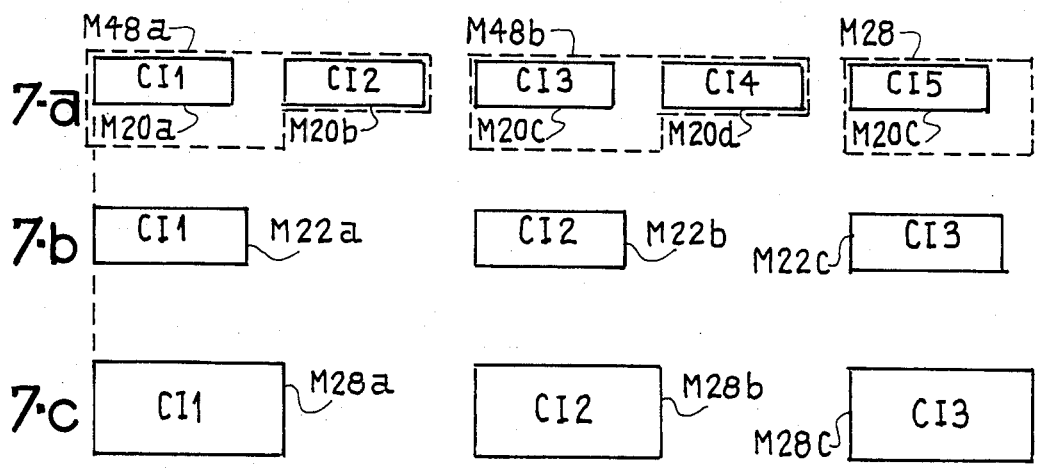
FIG_7

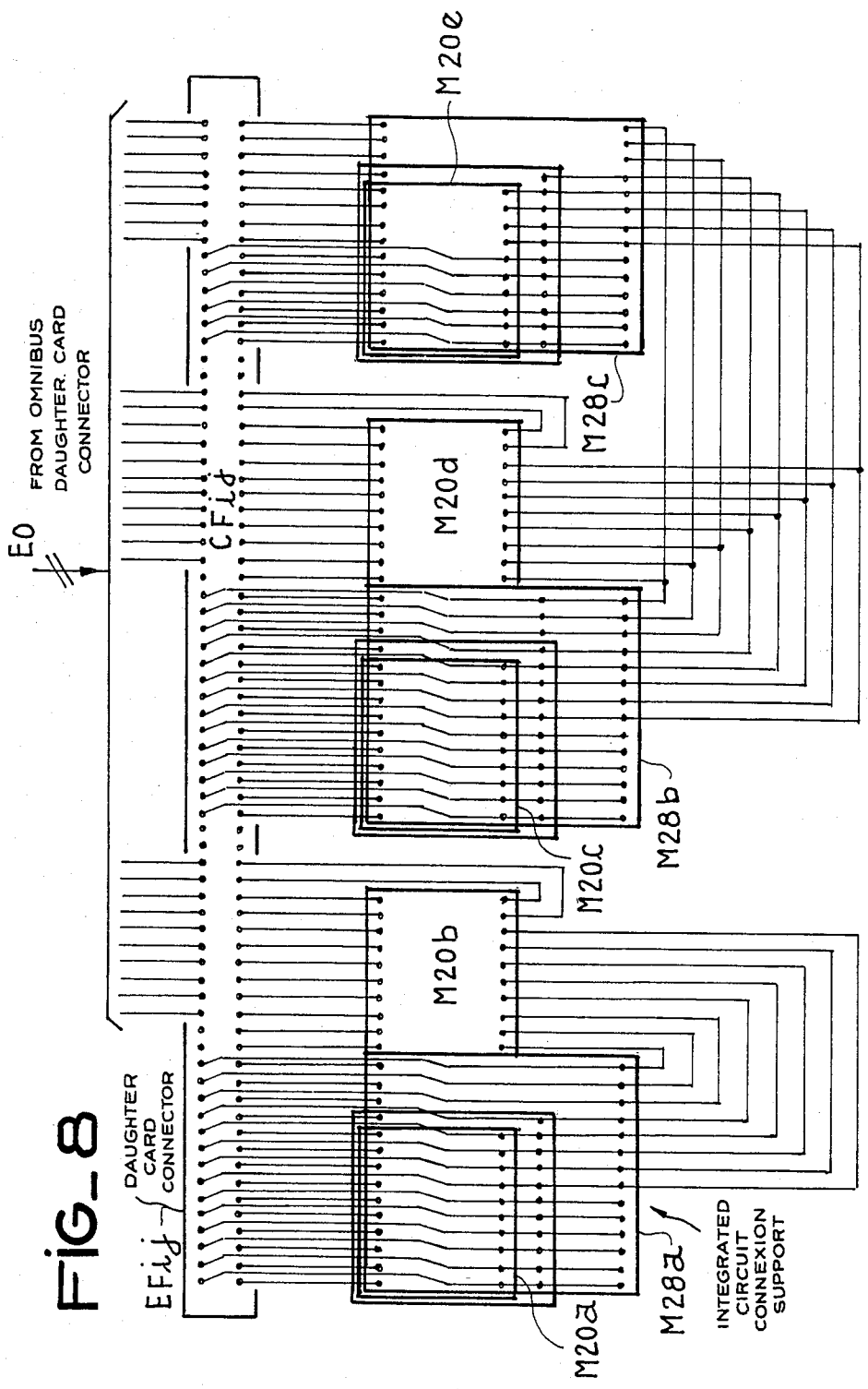

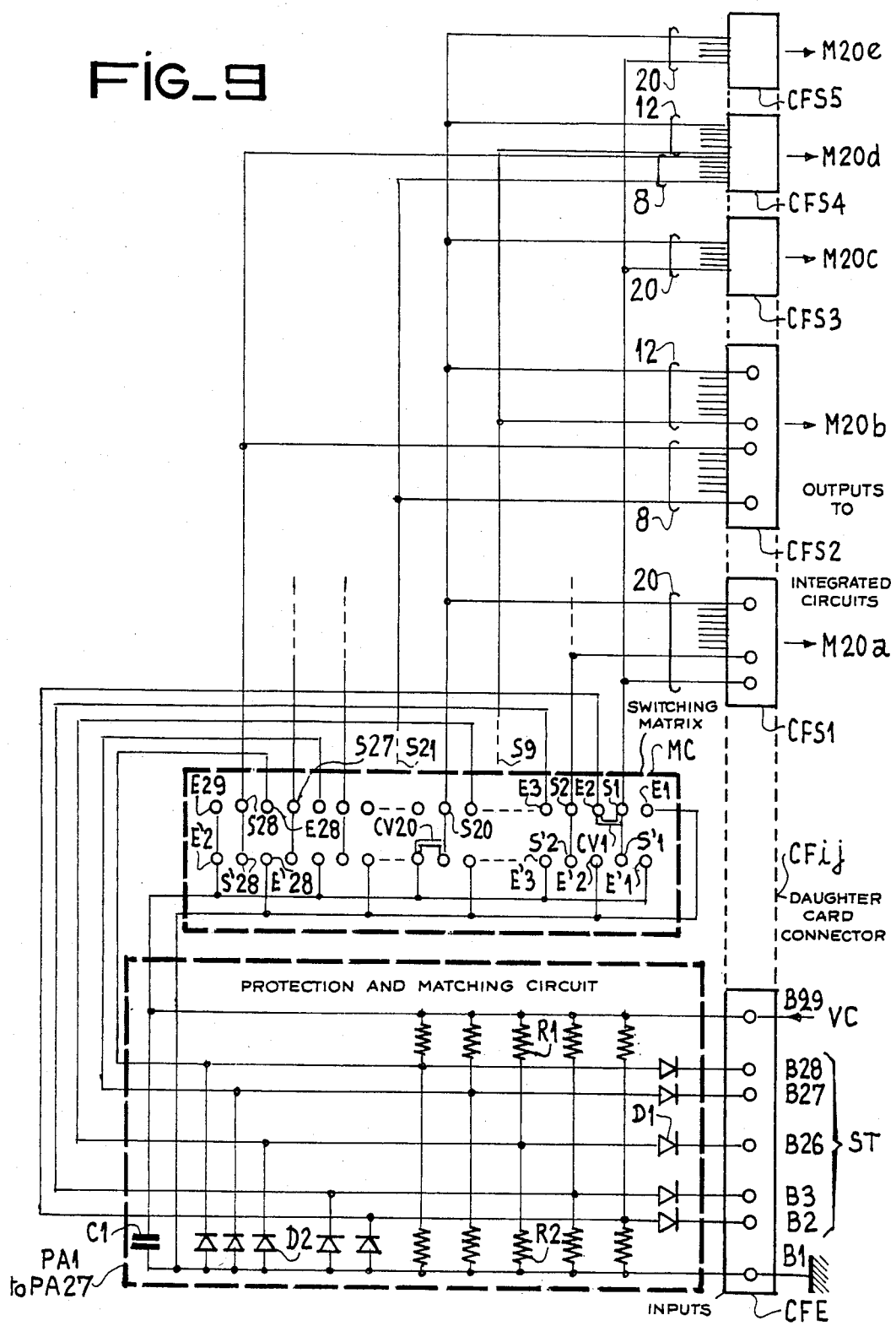

INTEGRATED-CIRCUIT SUPPORT DEVICE EMPLOYED IN A SYSTEM FOR SELECTING HIGH-RELIABILITY INTEGRATED CIRCUITS

This application is a continuation of application Ser. No. 396,451, filed July 8, 1982, now abandoned.

BACKGROUND OF THE INVENTION

This invention relates to an integrated-circuit support device employed in a system for the selection of circuits which are characterized by high reliability, selection being performed as a function of severe thermal and dynamic stresses on the principle known as dynamic burn-in testing. Equipment of this type serves to induce accelerated aging of components and failure of those components which are not capable of withstanding the stresses applied during the test. The other components which conform to the desired standards will thus be selected for subsequent fabrication of equipment components which exhibit a minimum failure rate and therefore a high degree of reliability.

An integrated-circuit support device is understood to refer to the array of plates provided for this purpose and placed within an oven in order to be subjected to predetermined operating stresses at high temperature, said plates being also intended to receive a predetermined number of dynamic signals from signal-generating circuits located outside the oven. An integrated-circuit support plate essentially consists of a large-sized printed circuit which is capable of withstanding extreme temperatures of high value and ranging from $-55°$ C. to $+125°$ C., provision being made for supports soldered on the printed circuit which is intended to receive the integrated circuits to be selected. The printed circuit design is such that only integrated circuits of one and the same type are accepted on a given plate and that the corresponding terminal pins having the same reference number are wired in parallel.

In known constructions, parallel wiring is carried out by means of a parent card and daughter cards positioned vertically on the parent card. The daughter cards remain dedicated to each type of integrated circuit and the circuit arrangement makes it possible to process a maximum of only seven signals which are transmitted to the integrated circuits.

A first disadvantage results from the large number of different plates which are necessary in order to cover the different ranges of existing integrated circuits. Apart from a few specific and special arrangements, the integrated circuits can be divided into three types on the basis of the terminal-pin connection system. The pitch of the terminal pins remains at a standard value of 1/10 of an inch but the distance between the two rows of pins has three values as follows: a first value of 3/10 of an inch in the case of circuits having up to twenty terminal pins, a second value of 4/10 of an inch in the case of circuits having twenty-two terminal pins, and a third value of 6/10 of an inch in the case of circuits having more than twenty-two terminal pins.

Practical requirements also entail an almost unlimited increase in the number of plates as a function of specification conditions laid down by users.

Plates of existing types also suffer from further limitations, especially in the field of individual protection of integrated circuits in which, in the case of known arrangements, daughter cards are provided as a rule only with current-limiting resistive elements.

SUMMARY OF THE INVENTION

The general aim of the invention is to overcome the disadvantages of current techniques by providing an integrated-circuit support device having a universal structure which permits easy and economical applications over a wide range of different integrated circuits to be selected. It is a particular aim of the invention to ensure continuity of selection until completion of the process while ensuring maximum efficiency by virtue of integral excitation of all the terminal pins and also ensuring operational safety at the first failure of supplies or of an integrated circuit. Capital investment costs involved in storage of plates are reduced to a low value, transfer from one integrated-circuit batch to another for selection purposes is facilitated, and management of the plate store is an easy task.

One object of the present invention is to provide a universal integrated-circuit support device consisting of a single type of plate for receiving respectively the integrated circuits which have relative spacing values of 0.3 in., 0.4 in. and 0.6 in. This results in a single topology of the parent card and thus enables the user to achieve a significant economy of investment capital. In the case of daughter cards, provision is again made for only a single type, thus making a further contribution to capital savings. In addition, the daughter cards perform a large number of functions as listed below:

distribution of electric power and of signals per subgroup of integrated circuits over all the terminal pins of the integrated circuits, individual isolation and protection of integrated circuits against a short-circuit fault in any one terminal pin of a defective circuit during the selection process, protection against positive or negative transient voltage surges of external origin, protection against excitation of parasitic oscillations, finally, adaptation of the plate to all types of terminal-pin connection of supplies and input-output signals of integrated circuits of currently known types by virtue of an array of plug-in U-links.

BRIEF DESCRIPTION OF THE DRAWING

These and other features of the invention will be more apparent to those skilled in the art upon consideration of the following description and accompanying drawings, wherein:

FIG. 1 is a diagram of an integrated-circuit selecting system in which a support device according to the present invention is employed;

FIG. 2 is a schematic diagram of one example of construction of the integrated-circuit support plate;

FIGS. 3 to 8 are schematic diagrams relating to one example of construction of the parent card of the support plate according to the invention;

FIG. 9 is a plugboard wiring diagram of the single type of daughter card employed in the example of construction of the support device shown in FIGS. 6 to 8.

DESCRIPTION OF THE PREFERRED EMBODIMENTS

The support plates according to the invention as shown in FIG. 1 are considered as being applicable to an integrated-circuit selecting system in order to highlight the relevant characteristics and basic design philosophy. The plates $Pl_1$, $Pl_2$, and so on, are placed within an oven ET in order to undergo predetermined thermal stresses. Each plate comprises a plurality of daughter cards $CF_1$, $CF_2$, and so on. Each daughter card is associated with a plurality of integrated circuits $CI_1$, $CI_2$, and so on. The remaining portion of the system comprises a processing and programming unit UT, supply circuits AL, an array AM of amplifiers ($A_1$ to $A_n$) for generating dynamic signals, safety circuits SC, temperature sensors $CT_1$, $CT_2$, and so on, which are placed within the oven ET. The processing unit UT has the function of management of the entire assembly and is programmed according to the specifications to be adopted in the case of the integrated circuits to be selected. The signals delivered by the safety unit SC serve to control and ensure good performance of the heat treatment unit ET, of all the circuits AM for generating dynamic signals and of the supply circuits AL.

The dynamic signals and the supply signals (including the reference ground potential) are transmitted respectively in parallel to the different plates located within the oven. These signals are received on each plate by means of a coupling connector $CP_1$, $CP_2$, and so on, said connector being usually formed by a plug rigidly fixed to the plate and designed for insertion into a socket which is rigidly fixed to the oven. The plate comprises a parent card and the daughter cards for interconnecting in parallel the signals applied to the different terminal pins of the respective integrated circuits, the same signal being applied to terminal pins which have the same reference number. This operation is performed by means of the printed circuits of the parent card and of the daughter cards. The printed circuit of the parent card provides a connection in parallel between the input connector of the plate and the different daughter cards and also between the connections extending from the daughter cards to the terminal pins of the integrated circuits. Each daughter card performs a redistribution of the signals in parallel in a number of channels corresponding to the number of integrated circuits associated with the daughter card. In the example shown in the figure, the number of associated integrated circuits $CI_1$ to $CI_4$ has been limited to four. This parallel distribution by means of the daughter cards is performed by means of a detecting and matching circuit PA. The interconnections between the parent card and the corresponding daughter cards are established by means of a connector $CN_{11}$ in the case of the daughter card $CF_1$, by means of a connector $CN_{12}$ in the case of the daughter card $CF_2$, and so on. Said connector is constituted by a socket rigidly fixed to the parent card in which a plug rigidly fixed to the daughter card is intended to be inserted. Each connector such as $CN_{11}$ consists of a group of input terminal pins equal in number to the corresponding external coupling connectors $CN_1$ and four groups of output terminal pins for supplying via the printed circuit of the parent card the respective terminal pins of the associated integrated circuits $CI_1$ to $CI_4$.

A first original feature of the device lies in the fact that all the terminal pins of the integrated circuits can be supplied with current, thereby entailing the need in particular for a corresponding number of amplifiers for generating dynamic signals. Another distinctive feature which is clearly brought to light in the detailed representation of the plate $PL_2$ lies in the fact that the parallel transmission of a dynamic signal such as the signal $S_1$ to the terminal pins of identical reference number of the integrated circuits supported by the plate takes place via an elementary protecting and matching circuit $PA_1$. The assembly PA is subdivided into a number of elementary protecting and matching circuits corresponding to the number of dynamic signal connections to be established.

According to the invention, the support device provides a single type of plate, one example of which is illustrated in FIG. 2, said plate being equipped with daughter cards CFij and with integrated circuits. In this example, the plate supports fifteen daughter cards distributed in three groups and each daughter card is associated with three integrated circuits, thus permitting the treatment of forty-five circuits. One of the daughter cards, namely the first card CF31 of the third group has been removed in order to show a corresponding coupling connector EF31. The design of the parent card CMj remains in the form of a double-face printed-circuit structure whilst the daughter cards CFij are in the form of a multilayer circuit having at least three layers in order to satisfy the requirements of the plugboard connection system. The non-visible rear face corresponds to the face which carries the soldered connections of the printed circuit of the parent card and provides interconnections and junctions between the external coupling connector CNj and the connector sockets EFij which support the daughter cards as well as between said sockets and the integrated-circuit support means, this being achieved by means of metallized holes formed in accordance with conventional techniques. The element CFO at the top of the support plate shown in FIG. 2 corresponds to a so-called "omnibus" daughter card which ensures distribution of the connections from CNj respectively to the three groups of daughter cards. The omnibus daughter card CFO thus serves to distribute the stimuli and the supplies from the connector CNj among the daughter cards CFij. Said omnibus daughter card is associated with three socket connectors EO1, EO2, EO3 which are mounted on the parent card and indicated in FIG. 5. The support EO1 receives the signals and supplies from the connector CNj and redistributes them directly to a first group of daughter cards CF11 to CF15 connected to the sockets EF11 to EF15 and indirectly via the omnibus daughter card and the sockets EO2 and EO3 to the second and third groups of daughter cards, that is, the cards CF21 to CF25 and CF31 to CF35 respectively.

From the point of view of interpretation, the simplified diagram of FIG. 5 shows the connections of the printed circuit of the parent card as well as the printed circuit of the daughter cards formed by parallel connection of the elements designated by the references a, b, c, d which form a daughter-card socket connector. Connection of the elements b, c, d to the associated integrated circuits is carried out by means of a particular type of plug-in connection unit EC which forms part of the printed circuit of the parent card. The different cards of the plate (parent card, daughter cards and omnibus card) are formed of materials having high-temperature strength and a low moisture absorption capacity.

A particular feature of the support device lies in the constructional design of the integrated-circuit connection supports. FIG. 3 illustrates the basic model employed for obtaining this particular plug-in unit which makes it possible to accept the different integrated-circuit packages and to have only one type of support plate. This plug-in connection unit EC replaces the traditional integrated-circuit support connectors which may be either of the high-profile or low-profile type and are employed in conventional practice for burn-in testing operations and which are specialized as a function of the number of terminal pins and of the length of integrated-circuit packages. The plug-in unit EC makes use of a plug socket having a frusto-conical internal profile of the so-called tulip type as a basic element for insertion of each terminal pin of an integrated circuit. These plug sockets are intended to receive the terminal pins of the integrated circuits and are disposed at intervals in four parallel rows as shown in the drawing of FIG. 3. In each row, the plug sockets are spaced at intervals corresponding to a standard pitch of 0.1 in. The spacing between the different rows corresponds to the three different values to be produced, namely 0.3 in., 0.4 in. and 0.6 in. The first row consists of fourteen plug sockets P1.1 to P1.14 in order to be associated either with the ten plug sockets of the second row P2.1 to P2.10 or with the eleven plug sockets of the third row P3.1 to P3.11 or alternatively with the fourteen plug sockets of the fourth row P4.1 to P4.14. Three modules which meet the various requirements have thus been formed: a module M20 formed by the plug sockets P1.1 to P1.10 and P2.1 to P2.10 for the reception of circuits having a maximum number of twenty terminal pins, a module M22 formed by P1.1 to P1.11 and P3.1 to P3.11 for testing circuits having twenty-two terminal pins, and the largest module M28 for selecting circuits having twenty-four to twenty-eight terminal pins, this third module being provided with the terminal pins P1.1 to P1.14 and P4.1 to P4.14.

FIG. 4 is a part-sectional view taken along line a—a of the preceding structure and makes it possible to gain a more precise idea of the design of the tulip-type plug sockets. The portion of each plug socket which is located externally of the printed circuit is adapted to receive one terminal pin of the integrated circuit whereas the internal portion of the plug socket consists of a pin which is soldered to the parent-card circuit through a metallized hole.

In one example of construction, the plug-in unit EC which is associated with each daughter card is composed of a plurality of modules arranged as shown in FIGS. 6 and 7. FIG. 6 shows a module M48 constructed from a module M28 (described earlier) with which a module M20 is incorporated. As shown in FIG. 7a, the plug-in unit EC comprises two modules M48. These three modules are distributed in such a manner as to ensure that the corresponding rows are in alignment. In this embodiment, it is possible to test five circuits having a maximum of twenty terminal pins as shown in FIG. 7a, or three circuits having twenty-two terminal pins (as shown in FIG. 7b), or three circuits having twenty-four to twenty-eight terminal pins (as shown in FIG. 7c). The interconnection printed circuit which terminates at the socket Pk.j can be so designed that plug sockets of the first row receive the odd-numbered supplies or stimuli, for example. The plug sockets of the same order as the other rows are connected together and these sockets receive the odd-numbered supplies or stimuli. The practical arrangement of these interconnections calls for a compromise between a limitation of the number of layers of the parent card to two, determination of the minimum area of daughter cards for ensuring maximum density of filling of the oven, a limitation of the number of layers of daughter cards to five for reasons of capital cost, determination of the optimum length of the daughter-card connector support EFij in relation to the length of a row of integrated circuits assigned to the daughter card.

In the example of construction under consideration, the compromise just mentioned has been satisfied as shown in detail in FIG. 8 by demultiplexing of the last eight signals on the printed circuit of the parent card, the other signals being demultiplexed on the printed circuit of the daughter card shown in FIG. 9. The socket connectors of the first row receive the even-numbered supplies or stimuli, for example, whilst the connectors of the same order of the other rows or in other words the second, third and fourth rows of coupling connectors of the circuits are connected together by means of the printed circuit of the parent card and receive the odd-numbered supplies or stimuli.

An expedient for interconnection on the parent card has also been adopted. Thus the last eight signals of the fourth row of the module M28 of the first two assemblies M48a and M48b are connected to the eight terminals of the second row of the following module M20 and also, in the case of the last connection, to the last eight terminals of the fourth row of the module M28c which terminates the assembly. This makes it possible to reduce the number of terminal pins available on the connection support EFij for reception of signals delivered by the corresponding connector EO of the omnibus card CFO.

In the different cases of utilization relating to the different circuit units, there are utilized a maximum number of twenty-eight signals (twenty-six stimuli, a direct-current voltage supply VC, and a connection to ground) produced by each daughter card CFij. By virtue of the interconnection expedient mentioned above, however, the last eight signals of order 21 to 28 inclusive are identical with the first eight signals of order 1 to 8 inclusive in the case of circuits having a width of 0.3 inch in which the number of terminal pins is equal to or smaller than twenty. The signals of order 1 to 20 are applied directly to the 0.3-in. circuits corresponding to the modules designated in FIG. 8 by the references M20a, M20c and M20e whilst the signals of order 9 to 28 arrive directly on the 0.3-in. circuits M20b and M20d. In regard to the 0.4-in. and 0.6-in. circuits, the signals of order 1 to 28 are applied directly to these circuits which are three in number. The necessary identity of the signals of order 21 to 28 with respect to the signals of order 1 to 8 in the case of the 0.3-in. circuits is also ensured by the interconnection expedient by programming of the selection logic. A further advantage of the plug-in connection unit EC relates to the direct use of the plates for selection of hybrid integrated circuits in the form of special packages.

The capacity of a plate having a universal structure in accordance with the embodiment indicated in the foregoing is seventy-five 0.3-in. circuits and forty-five 0.4-in. or 0.6-in. circuits. The external connector CNj and the supports EO1 to EO3 have twenty-nine active points for transmission of supplies and stimuli.

FIG. 9 illustrates the circuit of a daughter card in the field of application described earlier with reference to FIGS. 7 and 8. The daughter card comprises a 130-point connector CFij provided with twenty-nine inputs and one hundred outputs for carrying out the respective supply of the integrated circuits via the connector EFij and the printed circuit of the parent card. The connector CFij is thus subdivided into a portion CFE for receiving the input signals and into five portions CFS1 to CFS5 in order to transmit the signals to the integrated circuits. The portion CFE has twenty-nine terminals B1 to B29, a positive supply input +VC at the terminal B29, a terminal B1 for connection to ground or to a negative supply, and twenty-seven input terminals B2 to B28 to which the dynamic signals or stimuli are applied. These stimuli and supply input signals are connected via protecting and matching circuits PA1 to PA27 and via a switching matrix CM to the different output connectors CFS1 to CFS5.

The protecting and matching circuits perform the following principal functions:

isolation of the integrated circuits per group connected to a daughter card. In other words, in the event of a fault condition arising from a dead short in one of the integrated circuits associated with the daughter card CFij, only this group of integrated circuits is affected by the short-circuit and not the other groups of integrated circuits which are supplied respectively by the other daughter cards;

protection against positive or negative transients exceeding the direct-current supply voltage VC;

protection against excitation of parasitic oscillations related to the stray inductance of the connection which is external to the plate.

The circuit PA is composed of twenty-seven identical circuits each comprising (as shown in the case of the circuit relating to the terminal B20) two diodes D1 and D2 and two resistors R1 and R2 which are in the ratio $R2/R1 = 10$. The resistor bridge applies to the terminals of the resistor R2 a potential of the order of 0.9 times VC which is interpreted as a logic level "1".

If the potential on any one of the terminal pins becomes higher than the aforementioned value 0.9 VC, the diode D1 is caused to cut-off and the circuit assembly therefore ensures protection against positive overvoltages which might otherwise arrive at the terminal pin under consideration.

If the potential on any one of the terminal pins of the input portion CFE of the connector becomes equal to the reference level or in other words to ground, the diode D1 in that case becomes conductive and imposes with the resistor bridge R1–R2 a low-level potential of the order of 0.7 volt which is interpreted by the system as a logic level "0".

In the event that the potential should become lower than the ground potential on one of the terminal pins of the input portion CFE of the connector, the diode D2 is then caused to conduct in series with the diode D1, thus protecting the corresponding inputs of the integrated-circuit inputs which are connected to the terminal pin under consideration.

Should a stray inductance be present in series with one of the terminal pins of the input portion CFE, the reverse capacitance of the diode D2 associated with the value of the two resistors R1 and R2 connected in parallel represents a filter cell having a cut-off frequency of the order of approximately 100 MHz or in other words low-pass filtering which is effective in the case of inductance values lower than 1 microhenry. The external connections to the plate must be of short length or shielded.

The circuit PA further comprises a capacitor C1 for decoupling the supply voltage +VC.

The matrix MC for switching stimuli and supplies is constituted by a double row of socket connectors of the tulip type. The first row is composed of a sequence of connectors designated by the references E1, S1, E2, S2, ... E28, S28, E29. The second row is composed of the sequence E'1, S'1, E'2, ..., E'28, S'28, E'29. The supply VC is connected to the odd-numbered terminals E' of the second row as well as to the terminal E29 and the ground potential is connected to the even-numbered terminals E' of said second row as well as to the terminal E1. The input terminals B2 to B28 are connected respectively to the terminals E2 to E28 of the first row. The terminals S and S' having the same order in the two rows are connected together. The terminals S1 to S28 are connected to the output terminals of the connector portions CFS1 to CFS5 in the following manner: the portions CFS1, CFS3 and CFS5 each comprise twenty terminals connected respectively to the terminals S1 to S20 of the switching matrix MC. In regard to the other two portions CFS2 and CFS4, they are connected by means of their first eight terminal pins to the terminals S21 to S28 of the matrix MC and by means of their remaining twelve terminal pins to the terminals S9 to S21 of the matrix MC.

The design function of the switching matrix MC is to distribute the necessary signals (namely a maximum number of twenty-eight signals) to the connection EC of the parent card which has been described earlier with reference to FIGS. 7 and 8 and to adapt this distribution to all possible combinations of plug-in connection of integrated circuits. The switching matrix MC has terminals disposed in equidistant relation with a standard pitch of one-tenth of an inch in each row and it must also be considered that short-circuit U-links corresponding to this distance of one-tenth of an inch are provided for the purpose of establishing useful connections. Each U-link CV serves to connect two adjacent terminals of any one row. Each output S1 to S28 of the switching matrix is usually connected by means of a U-link CV to the adjacent terminal corresponding to the signal to be applied to said terminal. For instance, the terminal S1 which is connected to the terminal E2 by means of a U-link CV1 receives a signal from the terminal B2 of the input portion CFE of the connector, and so on in sequence. The terminal S1 can be connected to the terminal E1 by means of the U-link in order to be connected to ground (the terminal S'1 being connected to the terminal E'2 by means of said U-link). Finally, if the U-link connection is established between the terminals S'1 and E'1, the terminal S1 is connected to the voltage +VC. Thus all options are permissible in the case of each active point and it is possible to carry out normal transmission of a dynamic signal or replacement of said signal by one of the two direct-current supply potentials received from the terminals B1 or B29. The plate can thus be adapted as a function of the different types of integrated circuits.

The daughter-card and parent-card plug-in connection unit described with reference to FIGS. 8 and 9 makes it possible to supply in parallel the terminal pins having the same reference number in integrated circuits which are associated by means of one and the same signal (stimuli or supply signal) in the three cases of presentation which are contemplated (in FIGS. 7a, 7b and 7c).

By making use of a matching circuit designed for insertion in tulip-connectors and having the intended function of plug-in connection units for special types of integrated circuits, the device according to the invention can also be employed for treating these other types of integrated circuits such as, for example, round-package circuits TO-5 or TO-100.

It should be pointed out that, by virtue of a protecting and matching circuit PAj and of the switching matrix MC, the plate can be employed for treating multiplesupply integrated circuits. By way of example, provision can be made for a second supply voltage VC1 delivered to one of the terminal pins B2 to B28 instead of a dynamic signal, thus producing by means of the circuit assembly R1-R2 and the voltage VC a desired potential at the common point in order to supply corresponding terminal pins of the associated integrated circuits.

An integrated-circuit support device according to the invention permits economical performance of the integrated-circuit selection operations which are necessary in such industries as telecommunications, automobile equipment, avionics or in the fields of space technology, medical electronics and military applications. The device ensures high flexibility in the treatment of a wide variety of circuits and also permits highly efficient treatment by reason of the optimum number of dynamic signals applied to these circuits.

The support device described in the foregoing corresponds to a preferred embodiment since it consists of only a single version. On the other hand, printed circuits are of sufficient complexity to conform to the three different types of integrated-circuit package. It can be understood that an intermediate variant consists in simplifying the printed circuits subject in this case to the converse requirement, namely the need to manage a number of different plate designs. These different designs remain very small in number, however, since two or three types are sufficient. In the case of three different versions, the plates are equipped with tulip-type connector sockets corresponding respectively to the three types of spacing of integrated circuits, which means that there are in fact only two rows of socket connectors for each type of plate. An embodiment consisting of two plate designs partly results from the optimum solution described since one plate design has three rows for receiving two types of integrated circuits such as those which have a spacing of 4/10 in. or 6/10 in., for example. These variants are to be considered as included in the scope of the invention since they conform to the same spirit of simplification of plates and improvement of performances. In particular, such alternative forms provide the above-mentioned possibility of producing action on all the terminal pins of the printed circuit and of carrying out the signal-switching operations required by the plug-in connection operations to be performed.

What is claimed is:

1. An integrated-circuit support device employed in a system for selecting high-reliability circuits as a function of predetermined thermal and dynamic stresses, the support device comprising: a plurality of plates for receiving integrated circuits each of said integrated circuits having a plurality of terminal pins with each of said pins having a reference number, wherein said integrated circuit pins are arranged in two rows, and said plurality of plates establishing interface connections to connect in parallel those of said terminal pins of said integrated circuits having the same reference number, each plate being comprised of a parent card and a plurality P of daughter cards, the said interface connections being formed as a multilayer printed circuit on the daughter cards and is in the form of a double-face circuit on the parent card which is provided on one face with a first series of P socket connectors for receiving the said daughter cards and with a second series of NXP socket connectors for receiving said integrated circuits, each daughter card being associated with a plurality N of integrated circuits, the said plates having a similar structure to form only a first, a second and a third version of different plate designs by utilizing only three types of integrated-circuit socket connectors for receiving the different integrated-circuit packages of usual types which correspond respectively to spacing standards of 0.3 inch, 0.4 inch and 0.6 inch between the two rows of terminal pins, said first, second and third versions of plates being each equipped with one type of integrated-circuit socket connector corresponding to one of the spacing standards aforesaid, and the said printed circuits enabling separate and active connection of all the terminal pins of the integrated circuits through the corresponding daughter cards from a single coupling connector located externally of the plate.

2. An integrated-circuit support device employed in a system for selecting high-reliability circuits as a function of predetermined thermal and dynamic stresses, the support device comprising a plurality of plates for receiving integrated circuits having a plurality of terminal pins with each of said pins having a reference number wherein said integrated circuits pins are arranged in two rows, and said plurality of plates establishing interface connections to connect in parallel those of said terminal pins at said integrated circuits having the same reference number, each plate being composed of a parent card and a plurality of P of daughter cards, the said interface connections being formed as a multilayer printed circuit on the daughter cards and is in the form of a double-face circuit on the parent card which is provided on one face with a first series of P socket connectors for receiving the said daughter cards and with a second series of NXP socket connectors for receiving said integrated circuits, each daughter card being associated with a plurality N of integrated circuits, the said plates having a similar structure to form only a first and a second version of different plate design by utilizing only three types of integrated-circuit socket connectors for receiving the different integrated-circuit packages of usual types which correspond respectively to spacing standards of 0.3 inch, 0.4 inch and 0.6 inch between the two rows of terminal pins, said first and second versions of plates being equipped in said first version with integrated-circuit socket connectors corresponding to one of said spacing standards and in said second version with socket connectors corresponding to the other two standards, said connectors being constituted by rows of frusto-conical plug sockets of the tulip type, the said printed circuits enabling separate and active connection of all the terminal pins of the integrated circuits through the corresponding daughter cards from a single coupling connector located externally of the plate.

3. An integrated-circuit support device employed in a system for selecting high-reliability circuits as a function of predetermined thermal and dynamic stresses, the support device comprising a plurality of plates for receiving integrated circuits each of said integrated circuits having a plurality of terminal pins with each of said pins having a reference number, wherein said integrated circuits pins are arranged in two rows, and said plurality of plates establishing interface connections to connect in parallel those of said terminal pins of said integrated circuits having the same reference number, each plate being composed of a parent card and a plurality P of daughter cards, the said interface connections being formed as a same multilayer printed circuit on the daughter cards and is in the form of a double-face circuit on the parent card which is provided on one face with a first series of P socket connectors for receiving the said daughter cards and with a second series of NXP socket connectors for receiving said integrated circuits, each daughter card being associated with a plurality N of integrated circuits, the same plates each having the same structure to form a single version of plate design by utilizing only three types of integrated-circuit socket connectors for receiving the different integrated-circuit packages of usual types which correspond respectively to spacing standards of 0.3 inch, 0.4 inch and 0.6 inch between the two rows of terminal pins, said single version of plates being provided by making use of frustoconical tulip-type plug sockets in order to form said second series of socket connectors, said plug sockets being distributed in four rows so that the intervals between a first row and the second, third and fourth rows corresponding respectively to the said three integrated-circuit spacing standards.

4. A device according to claim 3, wherein the printed circuits are so determined as to permit separate and active connection of all the terminal pins of the integrated circuits through the corresponding daughter cards from a single coupling connector located externally of the plate.

5. A device according to claim 4, wherein, in accordance with a first basic module, the arrangement of the plug sockets comprises:

fourteen plug sockets in said first row, ten plug sockets in said second row, eleven sockets in said third row and fourteen sockets in said fourth row in order to receive a respectively integrated circuit having a spacing of 0.3 inch and having a maximum of twenty terminal pins, 0.4 inch circuits having twenty-two terminal pins and 0.6 inch circuits having twenty-four to twenty-eight terminal pins.

6. A device according to claim 5, wherein the plug sockets associated with a daughter card comprise three of said first basic modules as well as two other modules having two rows of ten plug sockets having a relative spacing of 0.3 inch in order to be capable of treating a total of five integrated circuits having a spacing of 0.3 inch or three integrated circuits having a spacing of 0.4 inch or 0.6 inch.

7. A device according to any one of claims 4 to 6 and 1-3, wherein the daughter cards comprise:

a plurality of signal-transmission connections; and means for protecting and matching integrated circuits, said means being constituted by a circuit inserted in each of said signal-transmission connections, said circuit including a first diode in series in said connection, the anode on the input side and the cathode on the output side, two resistors which form a voltage-dividing bridge between a direct-current supply voltage and ground and the common point of which is located on the connection downstream of the diode on the output side, and a second diode connected between said common point and ground, the anode being on the common-point side.

8. A device according to claim 7, wherein the daughter cards are formed by means of a printed circuit having at least three layers and wherein the protecting and matching means further comprise a switching matrix constituted by plug sockets of the tulip type and connection means for transmission of a dynamic signal or of a direct-current supply potential or of ground to each terminal of each integrated circuit to be selected according to the plug-in connection to be established.

9. A device according to claim 8, wherein the plug sockets of the switching matrix are uniformly spaced in two rows in order to produce said connections by means of a short-circuit U-link which is capable of occupying a number of different connection positions.

10. A device according to any one of claims 1-3 and 4 further including a system for selecting a high-reliability integrated circuit, wherein said system comprises power amplifiers for generating dynamic signals or stimuli which are equal in number to the maximum number of terminal pins of the integrated circuits to be selected, said number being reduced by the number of terminal pins which receive a direct-current supply voltages.

* * * * *